(12) United States Patent
Ye et al.

(10) Patent No.: US 11,658,154 B2
(45) Date of Patent: *May 23, 2023

(54) MEMORY DEVICES WITH CONTROLLERS UNDER MEMORY PACKAGES AND ASSOCIATED SYSTEMS AND METHODS

(71) Applicant: Micron Technology, Inc., Boise, ID (US)

(72) Inventors: Seng Kim Ye, Singapore (SG); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/909,522

(22) Filed: Jun. 23, 2020

(65) Prior Publication Data
US 2020/0321318 A1  Oct. 8, 2020

Related U.S. Application Data

(63) Continuation of application No. 16/043,049, filed on Jul. 23, 2018, now Pat. No. 10,727,206, which is a
(Continued)

(51) Int. Cl.
*H01L 25/065* (2023.01)
*H01L 25/18* (2023.01)
(Continued)

(52) U.S. Cl.
CPC ...... *H01L 25/0657* (2013.01); *G06F 13/1668* (2013.01); *G06F 13/1694* (2013.01);
(Continued)

(58) Field of Classification Search
CPC ..... H01L 25/0657; H01L 25/18; H01L 25/50; H01L 24/32; H01L 24/16; H01L 23/3135;
(Continued)

(56) References Cited

U.S. PATENT DOCUMENTS 6,266,753 B1  7/2001  Hicok et al.
6,930,378 B1  8/2005  St et al.
(Continued)

FOREIGN PATENT DOCUMENTS

JP  2007311395 A  11/2007
JP  2012129464 A  7/2012
(Continued)

OTHER PUBLICATIONS

Decision of Rejection dated Aug. 27, 2019 for Japanese Patent Application No. 2017-526646, 1 page.
(Continued)

*Primary Examiner* — Alexander O Williams
(74) *Attorney, Agent, or Firm* — Perkins Coie LLP

(57) ABSTRACT

Semiconductor devices with controllers under stacks of semiconductor packages and associated systems and methods are disclosed herein. In one embodiment, a semiconductor device includes a package substrate, a controller attached to the package substrate, and at least two semiconductor packages disposed over the controller. Each semiconductor package includes a plurality of semiconductor dies. The semiconductor device further includes an encapsulant material encapsulating the controller and the at least two semiconductor packages.

23 Claims, 6 Drawing Sheets

Related U.S. Application Data continuation of application No. 15/431,649, filed on Feb. 13, 2017, now Pat. No. 10,128,217, which is a continuation of application No. 14/550,243, filed on Nov. 21, 2014, now Pat. No. 9,627,367.

(51) Int. Cl.

| | | |
|---|---|---|
| *H01L 25/00* | (2006.01) | |
| *H01L 23/00* | (2006.01) | |
| *G06F 13/16* | (2006.01) | |
| *H01L 23/31* | (2006.01) | |
| *H01L 21/66* | (2006.01) | |
| *H01L 25/03* | (2006.01) | |

(52) U.S. Cl.
CPC ...... *H01L 23/3128* (2013.01); *H01L 23/3135* (2013.01); *H01L 24/04* (2013.01); *H01L 24/16* (2013.01); *H01L 24/32* (2013.01); *H01L 25/18* (2013.01); *H01L 25/50* (2013.01); *H01L 22/14* (2013.01); *H01L 24/13* (2013.01); *H01L 24/29* (2013.01); *H01L 24/33* (2013.01); *H01L 24/48* (2013.01); *H01L 24/49* (2013.01); *H01L 24/73* (2013.01); *H01L 24/81* (2013.01); *H01L 24/83* (2013.01); *H01L 24/92* (2013.01); *H01L 25/03* (2013.01); *H01L 2224/04042* (2013.01); *H01L 2224/1319* (2013.01); *H01L 2224/13083* (2013.01); *H01L 2224/16225* (2013.01); *H01L 2224/291* (2013.01); *H01L 2224/2919* (2013.01); *H01L 2224/2939* (2013.01); *H01L 2224/29294* (2013.01); *H01L 2224/32014* (2013.01); *H01L 2224/32145* (2013.01); *H01L 2224/32225* (2013.01); *H01L 2224/33181* (2013.01); *H01L 2224/48091* (2013.01); *H01L 2224/48145* (2013.01); *H01L 2224/48227* (2013.01); *H01L 2224/49113* (2013.01); *H01L 2224/73253* (2013.01); *H01L 2224/73257* (2013.01); *H01L 2224/73265* (2013.01); *H01L 2224/81855* (2013.01); *H01L 2224/81856* (2013.01); *H01L 2224/83* (2013.01); *H01L 2224/83101* (2013.01); *H01L 2224/83191* (2013.01); *H01L 2224/83855* (2013.01); *H01L 2224/83874* (2013.01); *H01L 2224/92227* (2013.01); *H01L 2224/92247* (2013.01); *H01L 2225/0651* (2013.01); *H01L 2225/06506* (2013.01); *H01L 2225/06562* (2013.01); *H01L 2225/06565* (2013.01); *H01L 2924/00014* (2013.01); *H01L 2924/1033* (2013.01); *H01L 2924/10253* (2013.01); *H01L 2924/14* (2013.01); *H01L 2924/143* (2013.01); *H01L 2924/1431* (2013.01); *H01L 2924/1434* (2013.01); *H01L 2924/1436* (2013.01); *H01L 2924/1437* (2013.01); *H01L 2924/1438* (2013.01); *H01L 2924/1443* (2013.01); *H01L 2924/15184* (2013.01); *H01L 2924/15192* (2013.01); *H01L 2924/15311* (2013.01); *H01L 2924/181* (2013.01); *H01L 2924/3025* (2013.01)

(58) Field of Classification Search
CPC ..... H01L 24/04; H01L 23/3128; H01L 22/14; H01L 24/49; H01L 24/92; H01L 2224/48145; H01L 25/03; H01L 24/81; H01L 24/83; H01L 24/13; H01L 24/48; H01L 24/73; H01L 24/29; H01L 25/065; H01L 25/00; H01L 23/00; H01L 23/31; H01L 2924/181; H01L 2924/3025; H01L 2924/15184; H01L 2224/81856; H01L 2224/32145; H01L 2924/10253; H01L 2924/14; H01L 2224/2939; H01L 2225/06565; H01L 2224/73253; H01L 2224/73265; H01L 2924/15311; H01L 2224/13083; H01L 2924/1443; H01L 2224/04042; H01L 2924/1436; H01L 2924/1434; H01L 2924/1033; H01L 2224/2919; H01L 2224/49113; H01L 24/33; H01L 2224/48227; H01L 2224/83855; H01L 2225/06562; H01L 2224/83; H01L 2924/143; H01L 2224/8319; H01L 2224/16225; H01L 2224/81855; H01L 2224/92247; H01L 2225/0651; H01L 2924/15192; H01L 2224/32014; H01L 2225/06506; H01L 2924/1431; H01L 2224/73257; H01L 2224/1319; H01L 2224/29294; H01L 2224/32225; H01L 2224/92227; H01L 2924/1437; H01L 2224/33181; H01L 2224/48091; H01L 2224/83874; H01L 2924/1438; H01L 2924/00012; H01L 2924/00014; H01L 2224/45099; H01L 2924/00; H01L 2224/83101; H01L 2924/0665; H01L 2224/291; H01L 2924/014; G06F 13/16; G06F 13/1694; G06F 13/1668
USPC ........................................ 257/777
See application file for complete search history.

(56) References Cited

U.S. PATENT DOCUMENTS

| | | | |
|---|---|---|---|
| 8,116,100 B2 | 2/2012 | Saen et al. | |
| 8,531,021 B2* | 9/2013 | Hu | H01L 25/105 |
| | | | 257/686 |
| 8,674,494 B2 | 3/2014 | Nam et al. | |
| 8,838,885 B2 | 9/2014 | Kwak et al. | |
| 8,890,294 B2 | 11/2014 | Cho et al. | |
| 9,406,660 B2* | 8/2016 | Ye | H01L 21/78 |
| 9,627,367 B2 | 4/2017 | Ye et al. | |
| 10,074,553 B2* | 9/2018 | Lin | H01L 25/50 |
| 10,727,206 B2* | 7/2020 | Ye | H01L 24/16 |
| 2002/0155640 A1* | 10/2002 | Wu | H01L 23/3677 |
| | | | 438/122 |
| 2003/0127719 A1 | 7/2003 | Chang | |
| 2005/0133916 A1 | 6/2005 | Karnezos | |
| 2006/0012018 A1 | 1/2006 | Karnezos et al. | |
| 2007/0013060 A1* | 1/2007 | Kwon | H01L 24/32 |
| | | | 257/725 |
| 2007/0090517 A1 | 4/2007 | Moon et al. | |
| 2007/0181989 A1* | 8/2007 | Corisis | H01L 24/46 |
| | | | 257/686 |
| 2007/0194462 A1 | 8/2007 | Kim et al. | |
| 2007/0241442 A1 | 10/2007 | Ha et al. | |
| 2008/0227238 A1 | 9/2008 | Ko et al. | |
| 2008/0237310 A1 | 10/2008 | Periaman et al. | |
| 2009/0020885 A1 | 1/2009 | Onodera et al. | |
| 2009/0086431 A1* | 4/2009 | Sakamoto | H05K 7/20009 |
| | | | 361/695 |
| 2009/0086454 A1* | 4/2009 | Sakamoto | H05K 5/065 |
| | | | 361/796 |
| 2009/0086455 A1* | 4/2009 | Sakamoto | H05K 7/1432 |
| | | | 361/796 |
| 2009/0161402 A1 | 6/2009 | Oh et al. | |
| 2009/0166887 A1 | 7/2009 | Upadhyayula et al. | |
| 2009/0174051 A1 | 7/2009 | Osaka et al. | |
| 2009/0218670 A1 | 9/2009 | Yamamoto et al. | |
| 2009/0321960 A1 | 12/2009 | Okumura et al. | |
| 2010/0025835 A1 | 2/2010 | Oh et al. | |
| 2010/0314740 A1 | 12/2010 | Choi et al. | |
| 2011/0029153 A1 | 2/2011 | Shah et al. | |

(56) References Cited

U.S. PATENT DOCUMENTS

| | | |
|---|---|---|
| 2011/0062563 A1 | 3/2011 | Yang et al. |
| 2011/0115010 A1 | 5/2011 | Shim et al. |
| 2011/0116247 A1* | 5/2011 | Kim ................ H01L 23/488 361/783 |
| 2011/0309497 A1 | 12/2011 | Wang et al. |
| 2012/0007227 A1 | 1/2012 | Cho et al. |
| 2012/0286411 A1 | 11/2012 | Watanabe et al. |
| 2012/0306089 A1 | 12/2012 | Freeman et al. |
| 2012/0314511 A1 | 12/2012 | Ishikawa |
| 2012/0317332 A1 | 12/2012 | Kwak et al. |
| 2013/0049221 A1 | 2/2013 | Han et al. |
| 2013/0119542 A1 | 5/2013 | Oh et al. |
| 2013/0130495 A1 | 5/2013 | Higashitani et al. |
| 2013/0148401 A1* | 6/2013 | Fai ................ H01L 23/5226 365/63 |
| 2013/0161788 A1 | 6/2013 | Chun et al. |
| 2013/0214396 A1 | 8/2013 | Kim et al. |
| 2013/0234342 A1 | 9/2013 | Shibata et al. |
| 2013/0270717 A1* | 10/2013 | Ko ................ H01L 25/065 257/777 |
| 2014/0097513 A1* | 4/2014 | Lee ................ H01L 25/105 257/528 |
| 2014/0246781 A1 | 9/2014 | Hosomi |
| 2014/0319702 A1* | 10/2014 | Yang ................ H01L 23/3114 257/777 |
| 2014/0353847 A1 | 12/2014 | Moon et al. |
| 2015/0115464 A1 | 4/2015 | Yu et al. |
| 2015/0131397 A1 | 5/2015 | Takeyama et al. |
| 2015/0178204 A1 | 6/2015 | Ray et al. |
| 2015/0187421 A1* | 7/2015 | Yan ................ H01L 25/50 361/783 |
| 2015/0187745 A1 | 7/2015 | Chiu et al. |
| 2015/0221624 A1 | 8/2015 | Bock et al. |
| 2015/0262708 A1 | 9/2015 | Lee |
| 2015/0270237 A1* | 9/2015 | Chi ................ H01L 21/486 257/737 |
| 2015/0301933 A1 | 10/2015 | Manohar et al. |
| 2015/0311185 A1* | 10/2015 | Ng ................ H01L 24/85 257/784 |
| 2015/0311186 A1 | 10/2015 | Ye et al. |
| 2016/0056091 A1 | 2/2016 | Kim et al. |
| 2016/0071810 A1 | 3/2016 | Park |
| 2016/0148918 A1 | 5/2016 | Ye et al. |
| 2016/0276312 A1* | 9/2016 | Shimizu ................ H01L 24/92 |
| 2016/0293560 A1* | 10/2016 | Liao ................ H01L 23/49838 |
| 2017/0025385 A1 | 1/2017 | Song et al. |
| 2017/0098633 A1* | 4/2017 | Kumar ................ H01L 23/3114 |
| 2017/0098634 A1* | 4/2017 | Kumar ................ H01L 25/105 |
| 2017/0162546 A1 | 6/2017 | Fai et al. |
| 2017/0170149 A1 | 6/2017 | Ye et al. |
| 2018/0090468 A1* | 3/2018 | Glennan ................ H01L 24/48 |
| 2018/0211936 A1 | 7/2018 | Chang et al. |
| 2018/0331004 A1* | 11/2018 | Guo ................ H01L 25/50 |
| 2019/0200471 A1 | 6/2019 | Takiar et al. |
| 2020/0006089 A1* | 1/2020 | Yu ................ H01L 25/0655 |
| 2020/0006252 A1* | 1/2020 | Yu ................ H01L 21/561 |
| 2020/0020669 A1* | 1/2020 | Uchida ................ H01L 23/16 |
| 2020/0105734 A1* | 4/2020 | Akada ................ H01L 25/50 |
| 2020/0105737 A1* | 4/2020 | Ng ................ H01L 25/50 |
| 2020/0211760 A1* | 7/2020 | Brassfield ........... H01F 41/0246 |
| 2020/0279832 A1* | 9/2020 | Ye ................ H01L 24/32 |
| 2020/0321316 A1* | 10/2020 | Watanabe ............. H01L 21/568 |
| 2020/0343221 A1* | 10/2020 | Pon ................ H01L 25/03 |
| 2020/0357773 A1* | 11/2020 | Ding ................ H01L 25/18 |
| 2020/0373289 A1* | 11/2020 | Yang ................ H01L 25/50 |
| 2020/0411439 A1* | 12/2020 | Teng ................ H01L 23/5386 |
| 2020/0411478 A1* | 12/2020 | Chen ................ H01L 24/48 |
| 2021/0098333 A1* | 4/2021 | Ku ................ H01L 24/29 |
| 2021/0183843 A1* | 6/2021 | Arifeen ................ H01L 23/13 |
| 2021/0249373 A1* | 8/2021 | Niwa ................ H01L 21/563 |

FOREIGN PATENT DOCUMENTS

| | | | |
|---|---|---|---|
| JP | 2012238725 A | 12/2012 | |
| JP | 2013131557 A * | 7/2013 | ............ H01L 24/73 |
| JP | 2013201218 A | 10/2013 | |
| JP | 2014179484 A | 9/2014 | |
| KR | 20060130125 A | 12/2006 | |
| KR | 20120137051 A | 12/2012 | |
| KR | 20130024567 A | 3/2013 | |
| TW | 200828561 A | 7/2008 | |
| TW | 201431013 A | 8/2014 | |
| TW | 201436118 A | 9/2014 | |
| TW | 201436167 A | 9/2014 | |
| WO | 2004034433 A3 | 8/2004 | |

OTHER PUBLICATIONS

Decision to Dismiss Amendment dated Aug. 27, 2019 for Japanese Patent Application No. 2017-526646, 4 pages.
EP Patent Application No. 15860345.6—Extended European Search Report, dated Jun. 13, 2018, 9 pages.
JP Patent Application No. 2017-526646—Japanese Office Action and Search Report, dated May 29, 2018, with English Translation, 21 pages.
KR Patent Application No. 10-2017-7015530—Korean Office Action and Search Report, dated Jul. 20, 2018, with English Translation, 17 pages.
Office Action and Search Report dated Jan. 18, 2019 for Taiwan Patent Application No. 107120206, 8 pages.
Office Action dated Dec. 25, 2018 for Japan Patent Application No. 2017-526646, 24 pages (with translation).
Office Action dated May 10, 2019 for Chinese Patent Application No. 201580062595.6, 9 pages (with translation).
Office Action dated Oct. 17, 2018 for Chinese Patent Application No. 201580062595.6.
TW Patent Application No. 106104970—Taiwanese Office Action and Search Report, dated Sep. 7, 2017, with English Translation, 14 pages.
TW Patent Application No. 106104970—Taiwanese Office Action, dated Apr. 11, 2018, with English Translation, 5 pages.
International Search Report and Written Opinion dated Feb. 25, 2016 in International Application No. PCT/US2015/061592, 14 pages.
Office Action dated Aug. 22, 2016 in Taiwan Application No. 104138661, 12 pages.
Office Action dated Oct. 26, 2020 for Chinese Patent Application No. 201580062595.6, 22 pages with translation.
Decision to Grant dated Mar. 2, 2019 for Japanese Patent Application No. 2017-526646, 41 pages (wit translation).
Office Action dated Oct. 6, 2020 for Japanese Patent Application No. 2017-526646, 19 pages (with translation).
Examination Report dated Mar. 4, 2021 for European Patent Application No. 15860345.6, 8 pages.

* cited by examiner

MEMORY DEVICES WITH CONTROLLERS UNDER MEMORY PACKAGES AND ASSOCIATED SYSTEMS AND METHODS

CROSS-REFERENCE TO RELATED APPLICATION(S)

This application is a continuation of U.S. patent application Ser. No. 16/043,049, filed Jul. 23, 2018, now U.S. Pat. No. 10,727,206; which is a continuation of U.S. patent application Ser. No. 15/431,649, filed Feb. 13, 2017, now U.S. Pat. No. 10,128,217; which is a continuation of U.S. patent application Ser. No. 14/550,243, filed Nov. 21, 2014, now U.S. Pat. No. 9,627,367; each of which is incorporated herein by reference in its entirety.

TECHNICAL FIELD

The disclosed embodiments relate to memory devices with memory packages and controllers. In several embodiments, the present technology relates to memory devices that include embedded controllers located under a stack of memory packages.

BACKGROUND

Flash memory is commonly used to store data for smart phones, navigation systems (e.g., automobile navigation systems), digital cameras, MP3 players, computers, and many other consumer electronic devices. Uniform Serial Bus (USB) devices, memory cards, embedded drives, and other data storage devices often include flash memory due to its small form factor. Dedicated memory controllers in electronic devices can manage data stored on flash memory. Unfortunately, these dedicated memory controllers can decrease the available space in the electronic devices for other components. To reduce the size of electronic devices, memory controllers can be integrated into host processors to, for example, increase the available space for other electronic components. For example, host processors may have integrated memory controllers (IMC) that manage data stored by flash memory, but these IMCs are compatible with specific types of memory and often cannot support new types of memory, such as new NAND memory designed for future standards (e.g., future versions of the embedded MultiMediaCard (eMMC) standard specification). Because IMCs limit electronic devices to particular types of flash memory, those electronic devices may be unable to use new memory with higher storage density, improved performance, or enhanced functionality.

Memory controllers can also be embedded within multi-die memory packages. For example, conventional eMMC memory can be a single high-capacity NAND package (e.g., a NAND package with stacked dies) with an embedded MultiMediaCard (MMC) controller. The embedded MMC controller can free a host processor from performing NAND memory management (e.g., write, read, erase, error management, etc.) that may require significant computing resources. Because NAND dies have small features that make testing difficult, the individual NAND dies are not tested before packaging. Multi-die NAND packages can be tested to identify bad packages (e.g., packages with bad NAND dies) to be discarded. Unfortunately, embedded MMC controllers in bad NAND packages are also discarded, resulting in increased manufacturing costs.

DETAILED DESCRIPTION

Specific details of several embodiments of memory devices and associated systems and methods are described below. The term "memory device" generally refers to a package having a package substrate, one or more multi-die memory packages, and a controller. The controller can be positioned under the memory packages and can provide memory management for each memory package. In some embodiments, memory devices can be flash memory (e.g., eMMC memory, Universal Flash Storage, etc.) with multi-die memory packages suitable for mobile devices (e.g., smart phones, tablets, MP3 players, etc.), digital cameras, routers, gaming systems, navigation systems, computers, and other consumer electronic devices. For example, the multi-die memory packages can be, for example, flash memory packages, such as NAND packages, NOR packages, etc. A person skilled in the relevant art will also understand that the technology may have additional embodiments, and that the technology may be practiced without several of the details of the embodiments described below with reference to FIGS. 1-6.

Figure 1:
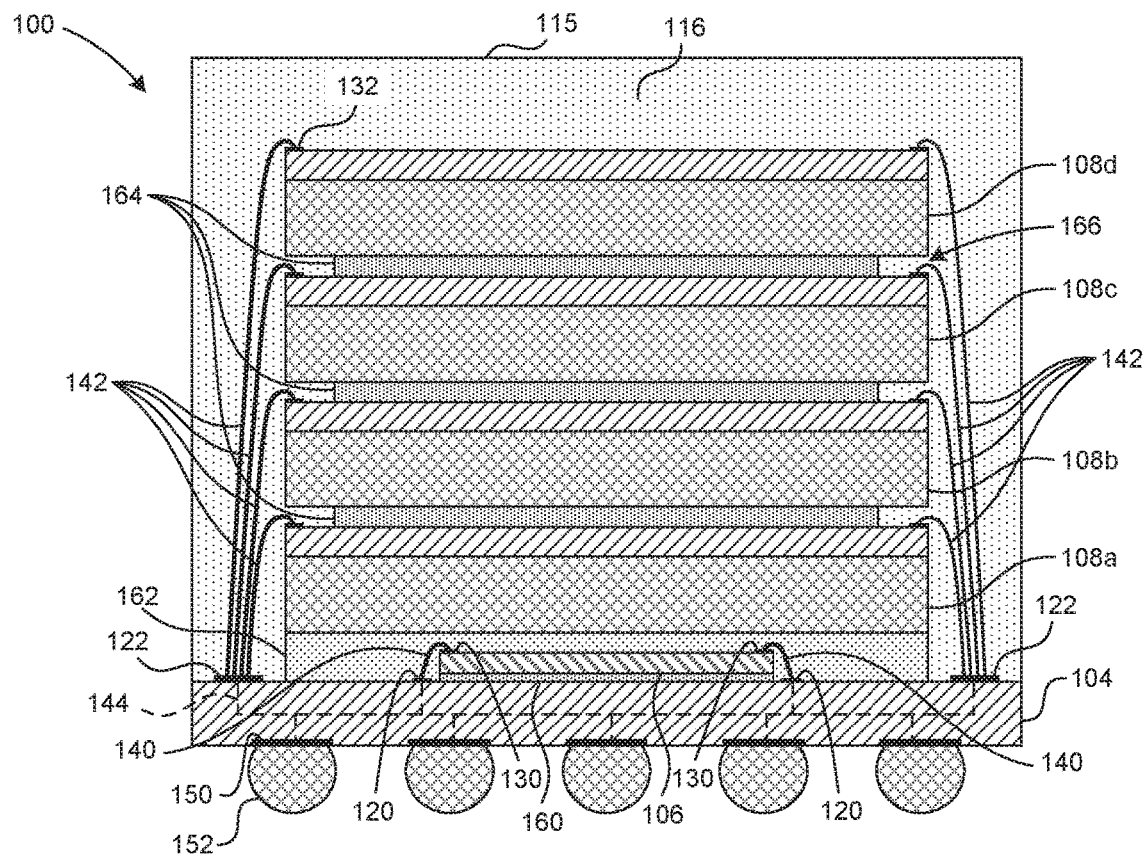
FIG. 1 is a cross-sectional view of a memory device configured in accordance with an embodiment of the present technology.

FIG. 1 is a cross-sectional view of a memory device 100 configured in accordance with an embodiment of the present technology. The memory device 100 can include a package substrate 104 ("substrate 104"), a controller 106, and first, second, third and fourth multi-die memory packages 108a, 108b, 108c, 108d (collectively "memory packages 108") arranged in a stack. The substrate 104 can be electrically coupled to the controller 106 and the memory packages 108 such that the controller 106 interfaces between the memory packages 108 and a host (e.g., a host processor of an electronic device) in communication with the memory device 100. The controller 106 can be attached to the substrate 104. In some embodiments, the controller 106 can be positioned under the stack of memory packages 108 such that the memory device 100 has a relatively small footprint.

The controller 106 can handle memory management so that a host processor is free to perform other tasks. In various embodiments, the controller 106 can include circuity, software, firmware, memory, or combinations thereof and can be configured to manage flash memory (e.g., NAND memory, NOR memory, etc.). In some embodiments, the controller 106 can be a controller die that includes a semiconductor substrate, such as silicon, silicon-on-insulator, compound semiconductor (e.g., Gallium Nitride), or other suitable substrates and can have any of variety of integrated circuit components or functional features, such as dynamic random-access memory (DRAM), static random-access memory (SRAM), other forms of integrated circuit devices, including processing circuits, imaging components, and/or other semiconductor devices for managing memory or other components. For example, the controller 106 can be a multi-media controller die (e.g., a MMC controller die) configured for use with NAND memory and can include circuitry, registers, interface modules (e.g., modules for interfacing with hosts, modules for interfacing with memory packages, etc.), and/or other modules for providing desired functionality.

The substrate 104 can include first bond pads 120 and second bond pads 122. The first bond pads 120 can be coupled to corresponding bond pads 130 of the controller 106 by first wire bonds 140, and the second bond pads 122 can be coupled to corresponding package contacts 132 (one identified) of each of the memory packages 108 by second wire bonds 142. In one embodiment, the substrate 104 is a single interposer that electrically couples the controller 106 to each memory package 108. The substrate 104 can include, for example, a printed circuit board, a multimedia card substrate, or other suitable interposer having electrical connectors 144 (shown schematically in dashed line), such as metal traces, vias, or other suitable connectors. The electrical connectors 144 can couple the controller 106, the first bond pads 120, and/or the second bond pads 122 to one another and/or to external circuitry (not shown) via package contacts 150 (one identified) and interconnects 152 (one identified) at the lower side of the substrate 104. The interconnects 152 can be bump bonds or other suitable connection features.

The controller 106 can be attached to the package substrate 104 by an adhesive 160. The adhesive 160 be an adhesive material (e.g., epoxy resin, adhesive paste, etc.), an adhesive laminate (e.g., adhesive tape, die-attach or dicing-die-attach film, etc.), or other suitable material. The first memory package 108a can be attached to the substrate 104 by an adhesive 162 that covers the controller 106 and the wire bonds 140. The additional memory packages 108b-d, in turn, are attached to one another by adhesive 164. In several embodiments, the adhesives 160, 162, 164 can comprise the same or similar materials. The adhesive 162 can have a greater thickness than the adhesive 164 to accommodate the portions of the wire bonds 140 between the controller 106 and the memory package 108a. The thickness of the adhesive 164 can be sufficiently large to ensure that the wire bonds 142 pass through gaps 166 (one identified) between adjacent memory packages 108. The memory device 100 can further include a package casing 115 comprising an encapsulant 116 that at least partially encapsulates the memory packages 108 and the wire bonds 142.

Figure 2:
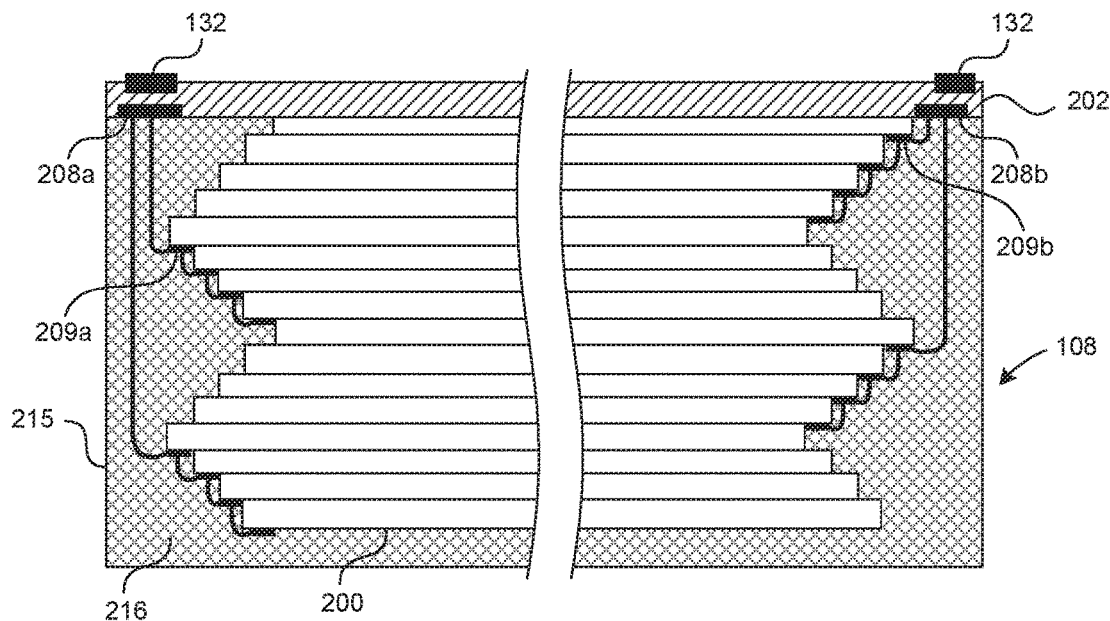
FIG. 2 is a cross-sectional view of a multi-die memory package configured in accordance with an embodiment of the present technology.

FIG. 2 is a cross-sectional view of a memory package 108 configured in accordance with an embodiment of the present technology. The memory package 108 can include a plurality of memory semiconductor dies 200 (one identified) and a memory package substrate 202 ("package substrate 202"). The package substrate 202 can include a plurality of first bond pads 208a and a plurality of second bond pads 208b. The first bond pads 208a can be coupled (e.g., wire bonded) to corresponding bond pads 209a (one identified) of a first group of the semiconductor dies 200 (e.g., two sets of four dies), and the second bond pads 208b can be coupled (e.g., wire bonded) to corresponding bond pads 209b (one identified) of a second group of the semiconductor dies 200 (e.g., two sets of four dies). In some embodiments, an array of the bond pads 208a is electrically coupled to an array of bond pads 209a of each semiconductor die 200. The configuration, number, and sizes of the bond pads 208a, 208b can be selected based on the configuration, number, and sizes of the respective bond pads 209a, 209b. In some embodiments, a row of bond pads 208b is electrically coupled to a row of bond pads 209b of each semiconductor die 200. The package substrate 202 can include, for example, an interposer, a printed circuit board, or other suitable substrate having electrical connectors, such as metal traces, vias, or other suitable connectors, including package contacts 132 (e.g., bond pads), interconnects (e.g., bump bonds) and/or other features for electrically coupling the memory package 108 to the substrate 104 (FIG. 1).

FIG. 2 shows the semiconductor dies 200 in a vertically stacked arrangement with adjacent semiconductor dies 200 laterally offset from one another. In other embodiments, the semiconductor dies 200 can be vertically stacked directly above one another (i.e., without any lateral offset), or in any other suitable stacked arrangement, and can be formed from semiconductor substrates, such as silicon substrates, silicon-on-insulator substrates, compound semiconductor (e.g., Gallium Nitride) substrates, or other suitable substrates. The semiconductor dies 200 can be cut or singulated dies and can have any of variety of integrated circuit components or functional features, such as non-volatile memory, flash memory (e.g., NAND flash memory, NOR flash memory, etc.), DRAM, SRAM, other forms of integrated circuit devices (e.g., processing circuits, imaging components and/or other semiconductor devices). Although the illustrated memory package 108 includes 16 memory dies 200, the memory package 108 can also be a multichip package with more or less than 16 memory dies (e.g., one die, two dies, four dies, eight dies, ten dies, twenty dies, etc.). The number of dies can be selected based on the desired storage capacity of the memory package 108. Because the embedded controller 106 can manage multiple memory packages, one or more of the memory packages (e.g., all the memory packages 108) may not have any embedded controller dies for memory management.

The memory package 108 can further include a package casing 215 composed of an encapsulant 116 (e.g., a thermoset material, an epoxy resin, or other suitable material) that at least partially encapsulates the stack of semiconductor dies 200 and the wire bonds. The package casing 215 can provide shielding from the ambient (e.g., from humidity), electrical isolation (e.g., between wire bonds), and/or protection of internal components during handling.

FIGS. 3A-3E are cross-sectional views illustrating a method for assembling the memory device 100 at various stages of manufacture in accordance with an embodiment of the present technology. Generally, the controller 106 can be coupled to the substrate 104 and then first memory package 108a can be coupled to the substrate 104 such that the controller 106 is positioned between the first memory package 108a and the package substrate 104. Additional memory packages can be stacked on the memory package 108a. After the memory packages 108 are electrically coupled to the substrate 104, the memory packages 108 can be encapsulated by the encapsulant 116. Details of the stages of manufacture are discussed in detail below.

Figure 3A:
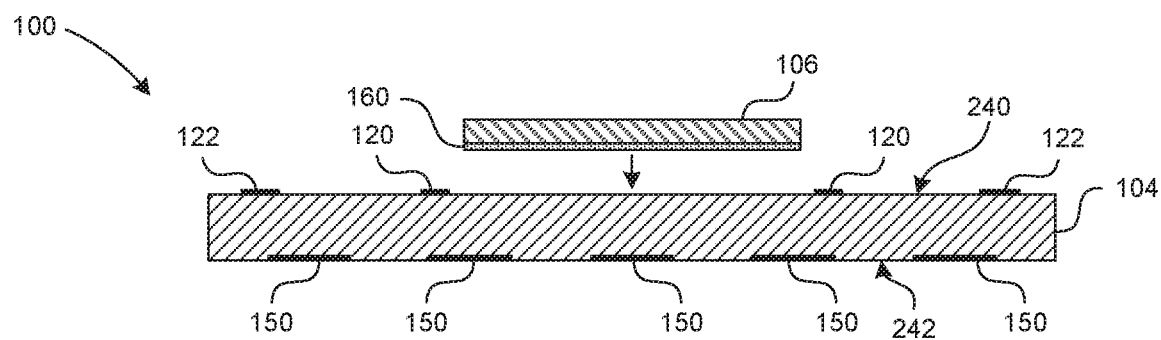
FIGS. 3A-3E are cross-sectional views illustrating a memory device at various stages of manufacture in accordance with an embodiment of the present technology.

Referring to FIG. 3A, the first and second bond pads 120, 122 can be located along an upper surface 240 of the substrate 104 (e.g., a silicon wafer with circuitry), and the package contacts 150 can be located along a lower surface 242 of the substrate 104. The controller 106 typically has a smaller footprint than the packages 108, so the controller 106 can be attached and electrically coupled to the substrate 104 before stacking the package assemblies 108. Advantageously, the controller 106 and its electrical connections (e.g., wire bonds 140) do not interfere with stacking and attaching of the memory packages 108. As shown in FIG. 3A, the controller 106 carrying the adhesive 160 can be placed on the upper surface 240 of the substrate 104 such that the controller 106 is spaced apart from the bond pads 120, 122 to provide sufficient clearance for wire bonding. The adhesive 160 can be die-attach adhesive paste or an adhesive element, for example, a die-attach film or a dicing-die-attach film (known to those skilled in the art as "DAF" or "DDF," respectively). In one embodiment, the adhesive 160 can include a pressure-set adhesive element (e.g., tape or film) that adheres the controller 106 to the substrate 104 when it is compressed beyond a threshold level of pressure. In another embodiment, the adhesive 160 can be a UV-set tape or film that is set by exposure to UV radiation.

Figure 3B:
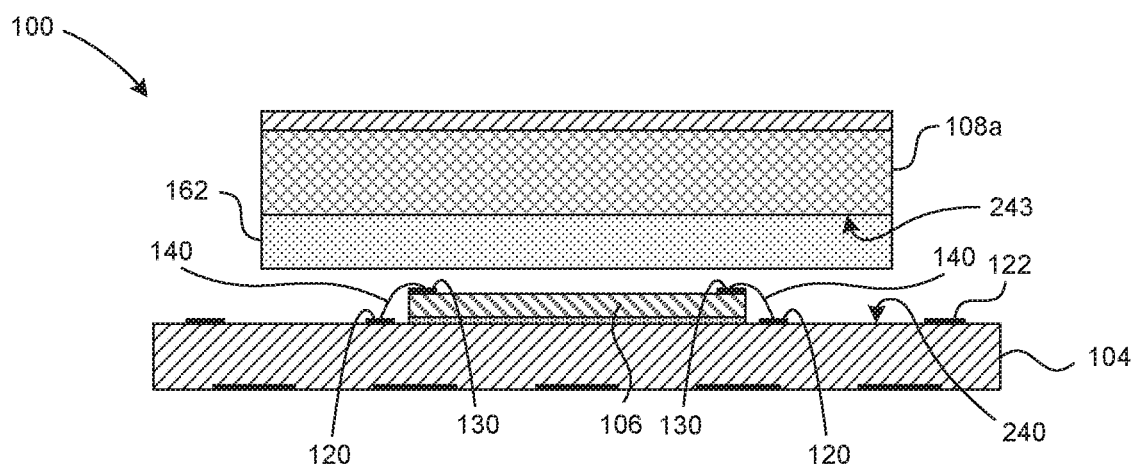

FIG. 3B shows the memory device 100 after attaching the controller 106 to the substrate 104 and forming the first wire bonds 140. Opposing lateral sides of the controller 106 can have an array of bond pads 130 (e.g., a row of bond pads 130) coupled to corresponding bond pads 120 (e.g., a row of bond pads 120) by the wire bonds 140. The package 108a can carry the adhesive 162 in the form of a "film-over-wire" material suitable for use with wire bonds. In other embodiments, the controller 106 can be directly coupled to the substrate 104 using solder or other suitable direct die attachment techniques. In such embodiments, the adhesive 162 can be DAF or DDF. The memory package 108a with the adhesive 162 can be placed on the upper surface 240 of the substrate 140 such that the memory package 108a extends laterally outward beyond the periphery of the controller 106. As such, the entire controller 106 can be located directly between the memory package 108a and the substrate 104 during assembly. The thickness of the adhesive 162 can be sufficiently large to prevent contact between a lower surface 243 of the memory package 108a and the wire bonds 140 to avoid damaging the wire bonds 140. Additionally, the bond pads 120 can be positioned directly underneath the memory package 108a to ensure that the electrical connections for the controller 106 do not interfere with subsequent wire bonding processes.

Figure 3C:
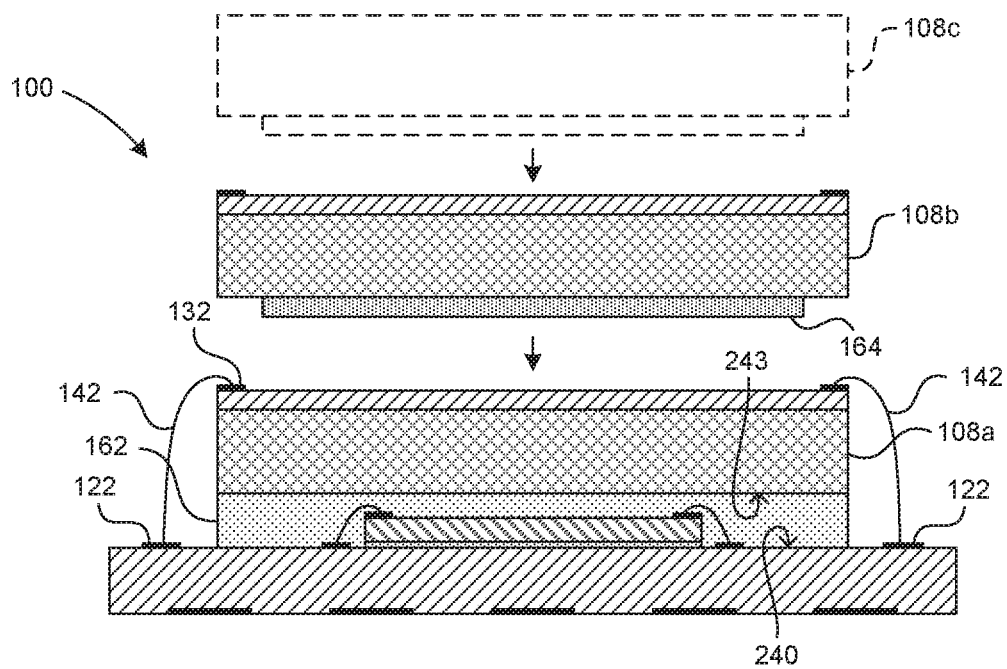

FIG. 3C shows the memory device 100 after attaching the memory package 108a to the substrate 104 and forming the second wire bonds 142. The second memory package 108b can be attached to the first memory package 108a using the adhesive 164. Additional memory packages (memory package 108c is shown in hidden line) can be stacked on the memory packages 108 and electrically coupled to the substrate 104. The thickness of the adhesive 164 can be selected to maintain a desired distance between adjacent memory packages 108 to avoid damaging the wire bonds 142. For example, the adhesive 164 can be sufficiently thick to prevent contact between the wire bonds 142 and the adjacent memory package 108 immediately above such wire bonds 142.

Figure 3D:
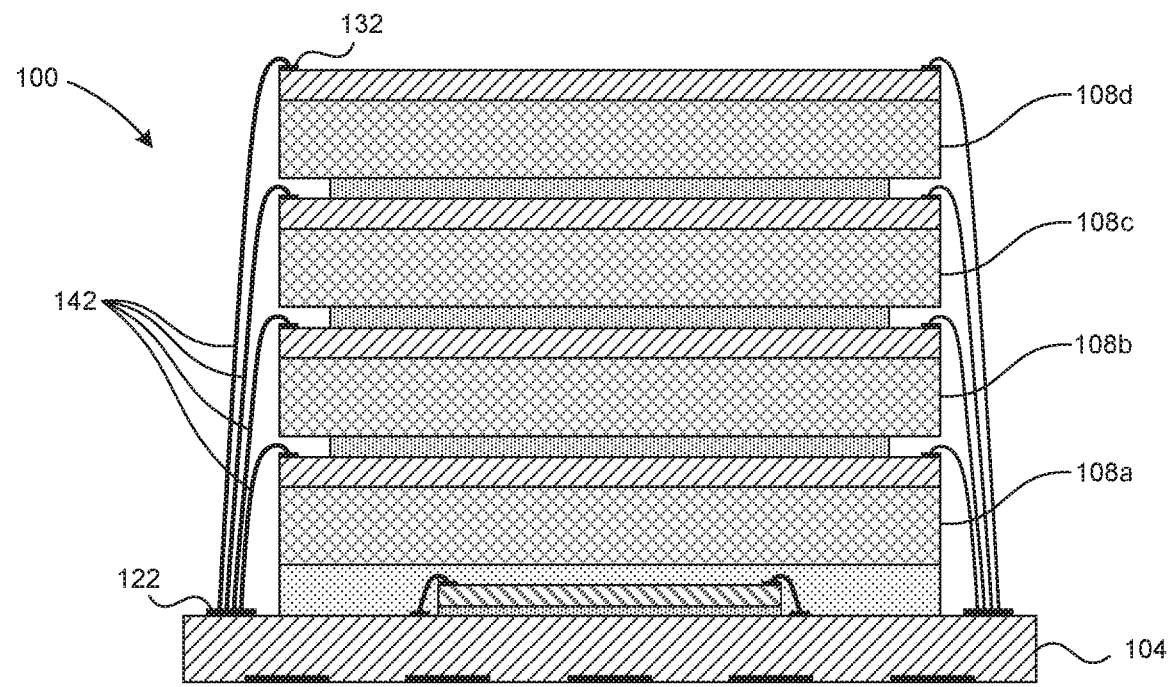

FIG. 3D shows the memory device 100 after each memory package 108 has been electrically coupled to the substrate 104 by the wire bonds 142. Opposing lateral sides of each memory package 108 can have an array of bond pads 132 (e.g., a row of bond pads 132) that are coupled to corresponding bond pads 122 (e.g., a row of bond pads 122) by the wire bonds 142. The illustrated memory device 100 has four memory packages 108. In other embodiments, the memory device 100 can carry more or fewer memory packages 108, for example, a single memory package 108, two memory packages 108, five memory packages 108, eight memory packages 108, ten memory packages 108, 15 memory packages 108, etc. The memory device 100 can include other packages or dies in addition to and/or in lieu of one or more of the memory packages 108. The number, configuration, and arrangement of memory packages and/or dies can be selected based on the desired functionality and dimensions of the memory device 100.

The memory packages 108 can be arranged in a vertical stack such that the memory packages 108 are centered relative to each other when viewed from above. Such an aligned arrangement can provide memory device 100 with a relative small footprint. In other embodiments, the vertically stacked memory packages 180 can be laterally offset from one another to provide increased clearance for accessing the bond pads 132. The direction and distance of lateral offset can be selected based on, for example, the wire bonding process or other subsequent processes. The memory packages 108 can be stacked in other arrangements and configurations to provide packages with desired overall sizes.

Figure 3E:
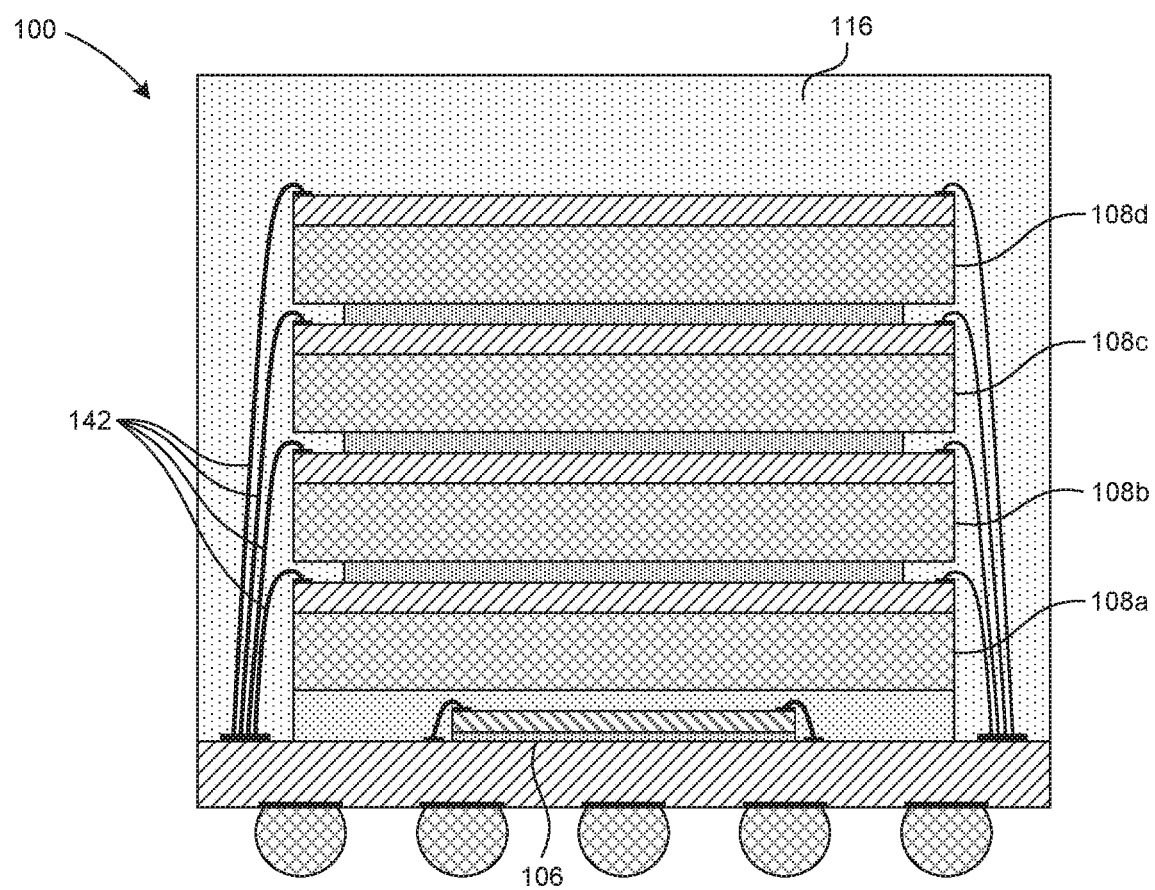

FIG. 3E shows the memory device 100 after the encapsulant 116 at least partially encapsulates the stack of memory packages 108 and the wire bonds 142 (one group of wire bonds is identified). The encapsulant 116 can include, for example, a thermoset material, a resin (e.g., epoxy resin), or other suitable material that provides, for example, mechanical support, shielding from the ambient (e.g., from humidity), and/or electrical isolation (e.g., between wire bonds), in some embodiments, the memory packages 108 and wire bonds 146 can be completely encapsulated by the encapsulant 116. After encapsulating the memory packages 108, processing can continue with subsequent manufacturing stages, such forming ball bonds, singulating, dicing, or other desired processes.

The manufacturing process of FIGS. 3A-3E can increase product yields because individual components can be tested before assembly. The memory packages 108 can be individually tested to ensure that each memory package 108 has known good dies (KGDs). For example, each memory package 108 can be tested to test each of the semiconductor dies 108 (FIG. 2). Advantageously, the substrate 202. (FIG. 2) of the memory package 108 can have relative large connections suitable for testing with standard testing equipment. The memory packages 108 with KGDs can be selected for assembly into packages while memory packages 108 with known bad dies can be discarded. Accordingly, the substrates 104 and controllers 106 are assembled only with good memory packages 108 to provide high production yields. Additionally, the substrate 104 can have a standard ball grid array or other suitable features (e.g., test pads) for testing the substrate 104, controller 106, memory packages 108, and/or other internal components after assembly. Defective memory devices 100 can be identified and discarded.

Figure 4:
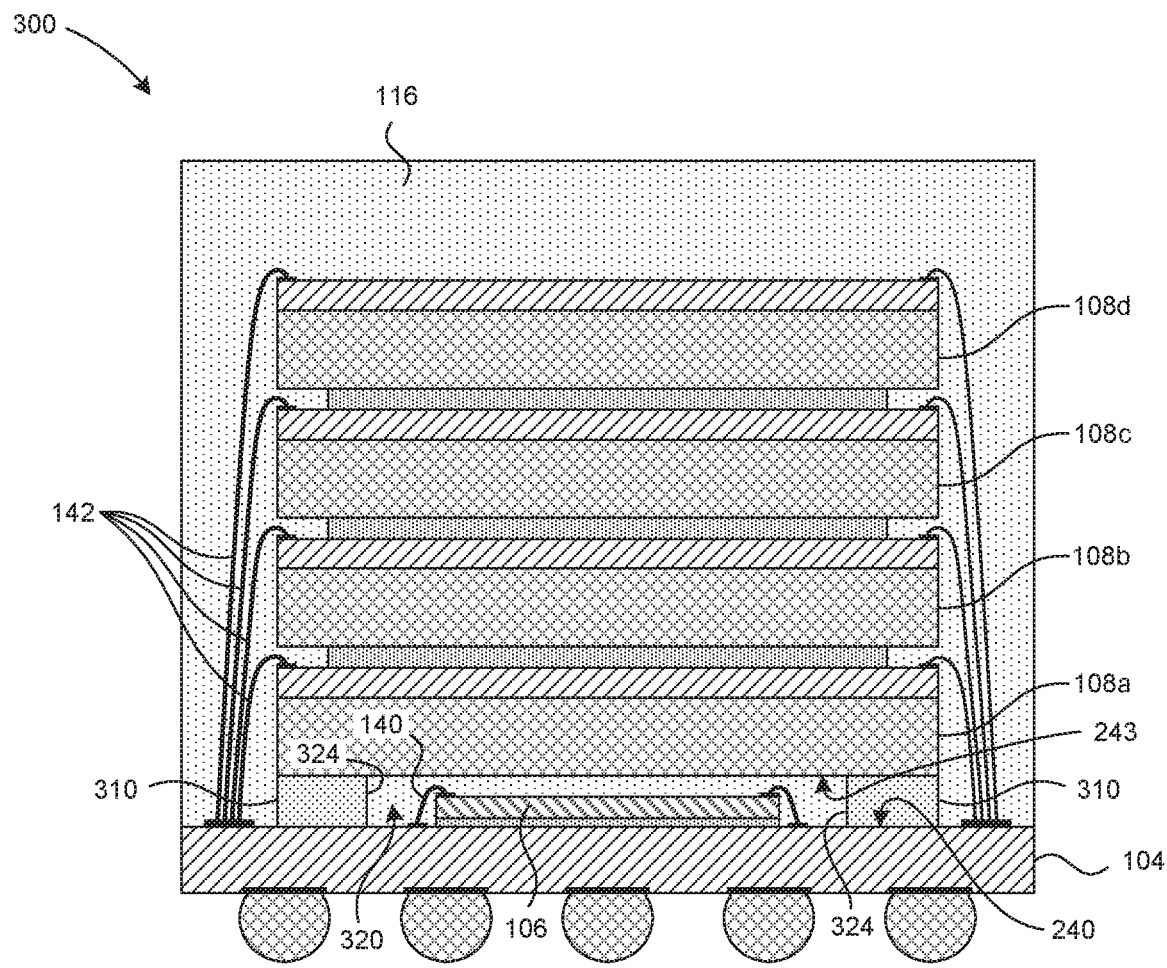
FIG. 4 is a cross-sectional view of a memory device configured in accordance with another embodiment of the present technology.

FIG. 4 is a cross-sectional view of a memory device 300 configured in accordance with another embodiment of the present technology. The memory device 300 can include features generally similar to those of memory device 100 described in connection with FIGS. 1-3E. The memory device 300 can include the memory packages 108 electrically coupled to the package substrate 104 by wire bonds 142 (one set identified), and the controller 106 can be electrically coupled to the package substrate 104 by the wire bonds 140 (one identified). The memory device 300 can also include one or more spacers 310 between the memory package 108a and the substrate 104. The spacers 310 can be cut or singulated pieces of silicon, or other suitable material, dimensioned to position the first memory package 108a slightly above the controller 106 and the wire bonds 140. An adhesive (e.g., adhesive paste, DAFs, adhesive tape, etc.) can be used to secure the spacers 310 to the substrate 104 and/or memory package 108a. Other types of spacers 310, such as a b-stage resin, can be used to space the memory package 108a apart from the substrate 104 by a desired distance and to secure the memory package 108a. The b-stage resin can be cured to fully adhere the memory package 108a to the substrate 104.

The encapsulant 116 can partially or completely encapsulate the stacked memory packages 108 and wire bonds 142, and the encapsulant 116 can also extend into a cavity 320 between the first memory package 108a and the substrate 104. The cavity 320 can be defined by sidewalls 324 of the spacers 310, the lower surface 243 of the memory package 108a, and the upper surface 240 of the substrate 104. During manufacturing, the encapsulant 116 can flow into the cavity 320 to at least partially encapsulate the controller 106 and the wire bonds 140 so that the encapsulant 116 electrically isolates the electrical connections coupling the controller 106 to the substrate 104.

Figure 5:
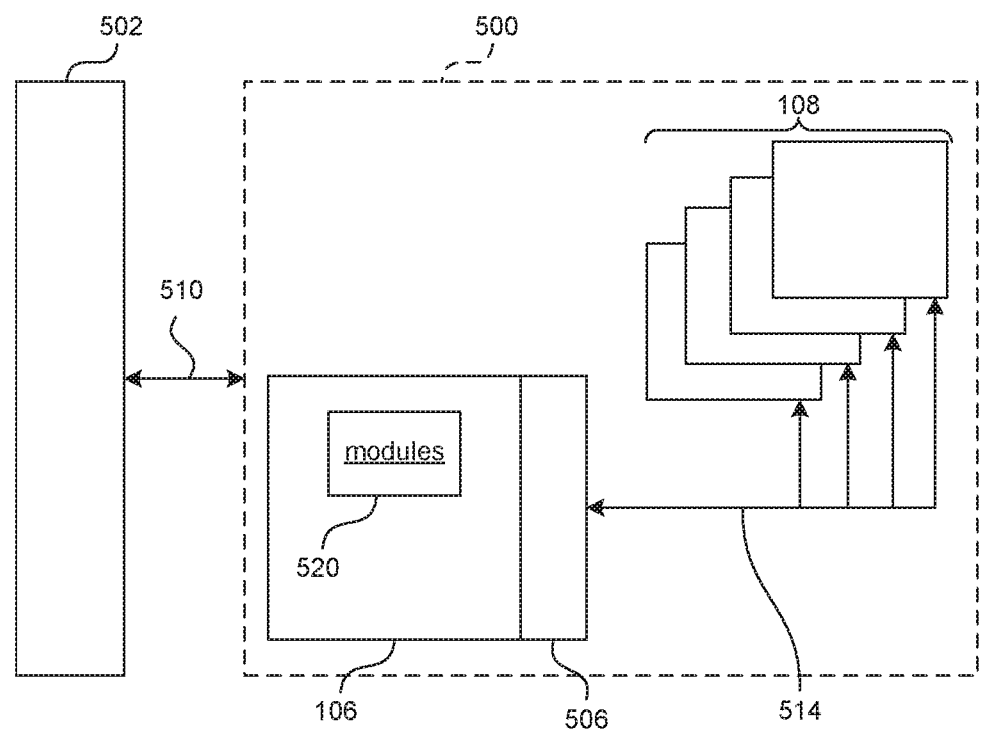
FIG. 5 is a block circuit diagram illustrating an implementation suitable for memory devices in accordance with an embodiment of the present technology.

FIG. 5 is a block circuit diagram illustrating an implementation of memory devices in accordance with an embodiment of the present technology. A memory device 500 can be one of the memory devices 100, 300 or can include features generally similar to those of memory devices 100, 300. The memory device 500 can be a package that manages data transfer between a host 502 and each of the memory packages 108. The controller 106 can be configured to provide memory control and can include one or more modules 520 for providing functionality. The modules 520 can include, without limitation, error correction code (ECC) modules for error corrections, error detection code (EDC) modules for error detection, wear levelling modules, address mapping modules for mapping of logical to physical blocks, modules for block management (e.g., bad block management, spare block management, etc.), error recovery modules, modules for partition protection, modules for booting from the controller 106, or other desired modules. The controller 106 can interface with the host 502 via a bus 510 and can include an interface 506 operatively coupled to the memory packages 108 via a memory bus 514. The controller 106 can be a MMC controller designed according to the MultiMediaCard specification (e.g., specification, versions 4.4, 4.41, etc.). In some embedded multimedia card (eMMC) embodiments, the controller 106 can have a bus 510 that provides bidirectional data signals (e.g., data signals for single bit data transfers, 4-bit data transfers, 8-bit data transfers, etc.), receives command signals from the host 502, responds to the host 502, and/or clocks signals for synchronizing bus transfers.

The host. 502 can include a device with processing power and can be capable of interfacing with the memory device 500. The host 502 may be a component (e.g., host controller, hardware, processor, driver, etc.) of a mobile device, a personal computer, a game console, or other electronic device capable of providing command input to the memory device 500. The controller 106 can manage data (e.g., write, read, erase data) based on the command input from the host 502.

Figure 6:
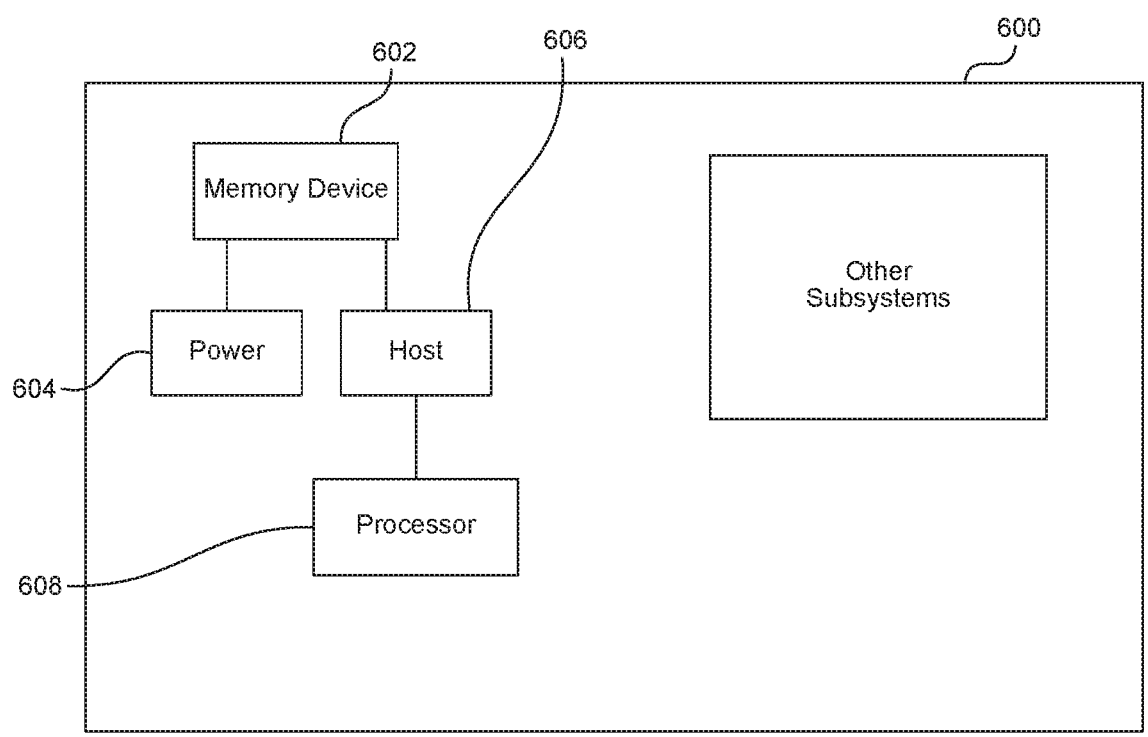
FIG. 6 is a schematic view of a system that includes a memory device configured in accordance with embodiments of the present technology.

Any one of the memory devices described herein can be incorporated into any of a myriad of larger and/or more complex systems, such as system 600 shown schematically in FIG. 6. The system 600 can include a memory device 602, a power source 604, a host 606 (e.g., I/O driver), a processor 608, and/or other subsystems or components 610. The memory device 602 can be one of the memory devices 100, 300, 500 or include features generally similar to those of the memory devices described above. The host 606 can include features generally similar to the host 502 of FIG. 5. The resulting system 600 can perform any of a wide variety of functions, such as memory storage, data processing, and/or other suitable functions. Accordingly, representative systems 600 can be, without limitation, hand-held devices (e.g., mobile phones, tablets, digital readers, and digital audio players), computers, digital cameras, appliances, and vehicles (e.g., cars, boats, planes). Components of the system 600 may be housed in a single unit or distributed over multiple, interconnected units (e.g., through a communications network). If the memory device 602 is removable, it can be replaced with another memory device (e.g., a new memory device with more advanced functionality). Each of the memory devices can be have an embedded controller configured to manage memory to avoid incompatibility between the host 606 and the onboard memory.

The size of the memory devices disclosed herein can be selected based on the size of the electronic device. By way of example, the memory device 100 of FIG. 1 or the memory device 300 of FIG. 4 can have a height in a range of about 4 mm to 7 mm, a width in a range of about 13 mm to 17 mm, and a length in a range of about 17 mm to 25 mm. Memory packages 108 (see FIGS. 1 and 2) can have heights in a range of about 0.75 mm to 1.5 mm (e.g., 1.2 mm), widths in a range of about 12 mm to 16 mm, and lengths in a range of about 16 mm to 20 mm.

The memory devices described herein can be incorporated into various types of storage devices. The memory devices (e.g., memory devices 100 or 300 in FIG. 1 or 4) with NAND packages can be incorporated into USB drives, memory cards, solid state drives, or other high density memory storage devices. Memory devices (e.g., memory devices 100 or 300 in FIG. 1 or 4) with NOR packages can be part of embedded devices. The memory devices disclosed herein can use different types of package-in-package (PIP) technologies, system-in-package (SIP) technologies, or other desired packaging technologies and can have, for example, ball grid arrays. For example, the memory devices 100 or 300 in FIG. 1 or 4 can be packages with a standard ball grid array.

From the foregoing, it will be appreciated that specific embodiments of the technology have been described herein for purposes of illustration, but that various modifications may be made without deviating from the disclosure. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list. Additionally, the terms "vertical," "lateral," "upper" and "lower" can refer to relative directions or positions of features in the memory devices in view of the orientation shown in the Figures. These terms, however, should be construed broadly to include memory devices and its components having other orientations, such as being flipped on their side or inverted.

Certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

What is claimed is:

1. A semiconductor device, comprising:
   a package substrate, wherein the package substrate includes a plurality of first bond pads and a plurality of second bond pads;
   a controller disposed over and attached to an upper surface of the package substrate;
   at least one spacer disposed over and attached to the upper surface of the package substrate and spaced laterally apart from the controller;
   at least one semiconductor package disposed over the controller opposite the package substrate and the at least one spacer and electrically connected to the package substrate, wherein the at least one semiconductor package includes a substrate, at least one semiconductor die, and a package casing at least partially encapsulating the at least one semiconductor die;
   an encapsulant material disposed over the upper surface of the package substrate, wherein the encapsulant material encapsulates the controller, the at least one spacer and the at least one semiconductor package;
   a plurality of first wire bonds that couple the plurality of first bond pads to the at least one semiconductor package; and
   a plurality of second wire bonds that couple the plurality of second bond pads to the controller.

2. The semiconductor device of claim 1 wherein the controller is configured to manage data transfer to and from each of the at least one semiconductor package.

3. The semiconductor device of claim 1, wherein each of the at least one semiconductor package includes at least one semiconductor die.

4. The semiconductor device of claim 1 wherein the at least one semiconductor package comprises two semiconductor packages attached to one another by a die-attach adhesive.

5. The semiconductor device of claim 1 wherein the at least one semiconductor package includes a first memory package and a second memory package, wherein the first memory package is attached to the at least one spacer, and the second memory package is attached to the first memory package by a die-attach adhesive.

6. The semiconductor device of claim 1 wherein the at least one semiconductor package comprises flash memory and include NAND memory and/or NOR memory.

7. The semiconductor device of claim 1 wherein the at least one semiconductor package is a NAND memory package without an embedded controller.

8. The semiconductor device of claim 1 wherein the at least one semiconductor package includes at least one memory package, and wherein the controller is configured to command the at least one memory package to read data, erase data, and/or write data.

9. The semiconductor device of claim 1 wherein the at least one spacer comprises silicon.

10. The semiconductor device of claim 1 wherein the at least one spacer comprises b-stage resin.

11. The semiconductor device of claim 1 wherein the at least one spacer is secured to the substrate by an adhesive.

12. A multimedia device configured to couple to a host, comprising:
    an interposer, wherein the interposer includes a plurality of first bond pads and a plurality of second bond pads;
    a memory package electrically coupled to the interposer, wherein the memory package includes a substrate, at least one semiconductor die, and a package casing at least partially encapsulating the at least one semiconductor die;
    a multimedia controller die disposed over and attached to an upper surface of the interposer and positioned between the memory package and the upper surface of the interposer;
    a spacer disposed over and attached to the upper surface of the interposer and spaced laterally apart from the multimedia controller die, wherein the spacer is between the memory package and the interposer;
    an encapsulant disposed over the upper surface of the interposer, wherein the encapsulant encapsulates the memory package, the spacer, and the multimedia controller die;
    a plurality of first wire bonds that couple the plurality of first bond pads to the memory package; and
    a plurality of second wire bonds that couple the plurality of second bond pads to the multimedia controller die.

13. The multimedia device of claim 12 wherein the multimedia controller die is configured to manage data transfer between the host and the memory package.

14. The multimedia device of claim 12 wherein the multimedia controller die is coupled to the memory package.

15. The multimedia device of claim 12 wherein the multimedia controller die is configured to provide error correction, block management, wear levelling, and/or physical to logical mapping.

16. The multimedia device of claim 12 wherein the multimedia controller die includes a memory interface coupled to the memory package.

17. The multimedia device of claim 12 wherein the memory package is a NAND package.

18. A semiconductor device, comprising:
    a package substrate, wherein the package substrate includes a plurality of first bond pads and a plurality of second bond pads;
    a controller disposed over and attached to an upper surface of the package substrate;
    at least one semiconductor package disposed over the controller opposite the package substrate and electrically connected to the package substrate, the at least one semiconductor package including a substrate, at least one semiconductor die, and a package casing at least partially encapsulating the at least one semiconductor die;
    an encapsulant material disposed over the upper surface of the package substrate, wherein the encapsulant material encapsulates the controller and the at least one semiconductor package;
    a plurality of first wire bonds that couple the plurality of first bond pads to the at least one semiconductor package; and
    a plurality of second wire bonds that couple the plurality of second bond pads to the controller.

19. The semiconductor device of claim 18 wherein the controller is configured to manage data transfer to and from each of the at least one semiconductor package.

20. The semiconductor device of claim 18, wherein the at least one semiconductor package includes a first memory package and a second memory package, wherein the first memory package is attached to the controller, and the second memory package is attached to the first memory package by a die-attach adhesive.

21. The semiconductor device of claim 18, wherein the at least one semiconductor package comprises flash memory and include NAND memory and/or NOR memory.

22. The semiconductor device of claim 18, wherein the at least one semiconductor package is a NAND memory package without an embedded controller.

23. The semiconductor device of claim 18, wherein the at least one semiconductor package includes at least one memory package, and wherein the controller is configured to command the at least one memory package to read data, erase data, and/or write data.

* * * * *